(12) United States Patent
Iida et al.

(10) Patent No.: US 10,214,822 B2
(45) Date of Patent: Feb. 26, 2019

(54) ELECTRODE, MEMBRANE ELECTRODE ASSEMBLY, ELECTROCHEMICAL CELL, AND STACK

(71) Applicant: Kabushiki Kaisha Toshiba, Minato-ku (JP)

(72) Inventors: Atsuko Iida, Yokohama (JP); Norihiro Yoshinaga, Kawasaki (JP); Shigeru Matake, Yokohama (JP); Wu Mei, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 144 days.

(21) Appl. No.: 15/262,310

(22) Filed: Sep. 12, 2016

(65) Prior Publication Data
US 2017/0183788 A1    Jun. 29, 2017

(30) Foreign Application Priority Data

Dec. 25, 2015 (JP) .................................. 2015-255109

(51) Int. Cl.
    *C25B 11/00* (2006.01)
    *C25B 11/04* (2006.01)
    (Continued)

(52) U.S. Cl.
    CPC ...... *C25B 11/0447* (2013.01); *C23C 14/0036* (2013.01); *C23C 14/083* (2013.01);
    (Continued)

(58) Field of Classification Search
    CPC .... C25B 9/00; C25B 9/06; C25B 9/08; C25B 9/10; C25B 11/00; C25B 11/04;
    (Continued)

(56) References Cited

U.S. PATENT DOCUMENTS 5,578,175 A * 11/1996 Lin ................... C25B 11/0478
                                            204/290.12
8,425,740 B2    4/2013 Sasaki et al.
(Continued)

FOREIGN PATENT DOCUMENTS

JP    2010-33759    2/2010
JP    2012-204221   10/2012
(Continued)

OTHER PUBLICATIONS

Ioroi et al (Journal of the Electrochemical Society, 147, 6, pp. 2018-2022 (2000)). (Year: 2000).*

*Primary Examiner* — Alexander W Keeling
(74) *Attorney, Agent, or Firm* — Oblon, McClelland, Maier & Neustadt, L.L.P.

(57) ABSTRACT

An electrode of an embodiment includes a base material, and a catalyst layer provided on the base material and having a porous structure. When a sum of heights of all peaks belonging to Ir oxide is I0, the height of a peak of $IrO_2$ (110) is I1, and the height of a peak of $IrO_2$ (211) is I2, a ratio of (I1+I2)/I0, which is a ratio of spectra obtained by X-ray diffraction measurements using $K\alpha$ rays of Cu in the catalyst layer, is 50% or more and 100% or less in a range of a diffraction angle of 20 degrees or more and 70 degrees or less.

13 Claims, 4 Drawing Sheets

(51) Int. Cl.
   *C25B 1/10* (2006.01)
   *C23C 14/00* (2006.01)
   *C23C 14/08* (2006.01)
   *C23C 14/58* (2006.01)

(52) U.S. Cl.
   CPC ............ *C23C 14/5806* (2013.01); *C25B 1/10* (2013.01); *C25B 11/0415* (2013.01); *C25B 11/0478* (2013.01); *C25B 11/0484* (2013.01); *Y02E 60/366* (2013.01)

(58) Field of Classification Search
   CPC ............. C25B 11/0405; C25B 11/0442; C25B 11/0447; C25B 11/0473; C25B 11/0478; C25B 11/0484; C25B 11/0494; C25B 11/03–11/035; H01M 4/00; H01M 4/86
   See application file for complete search history.

(56) References Cited

U.S. PATENT DOCUMENTS

| | | |
|---|---|---|
| 2010/0021787 A1 | 1/2010 | Wu et al. |
| 2011/0048955 A1 | 3/2011 | Petrossians et al. |
| 2012/0251915 A1 | 10/2012 | Mei et al. |
| 2013/0078550 A1* | 3/2013 | Mei .................. H01M 4/92 |
| | | 429/482 |
| 2014/0353148 A1 | 12/2014 | Cao et al. |

FOREIGN PATENT DOCUMENTS

| | | |
|---|---|---|
| JP | 5395791 | 1/2014 |
| JP | 5686457 | 3/2015 |
| JP | 5728452 | 6/2015 |

* cited by examiner

ELECTRODE, MEMBRANE ELECTRODE ASSEMBLY, ELECTROCHEMICAL CELL, AND STACK

CROSS-REFERENCE TO RELATED APPLICATION

This application is based upon and claims the benefit of priority from Japanese Patent Application No. 2015-255109, filed on Dec. 25, 2015; the entire contents of which are incorporated herein by reference.

FIELD

Embodiments described herein relate to an electrode, a membrane electrode assembly, an electrochemical cell, and a stack.

BACKGROUND

In recent years, research on electrochemical cells has actively been conducted. For example, polymer electrolyte membrane-electrolyze cells (PEMECs) of electrochemical cells are superior in responsiveness to renewable energy of photovoltaic power generation and the like and so are expected to be utilized for generating hydrogen of large-scale energy storage systems. To ensure sufficient durability and water electrolysis performance, platinum nano-particle catalyst is commonly used for a cathode of PEMEC and a particulate iridium based catalyst is commonly used for an anode thereof.

One big challenge for widespread use of PEMEC is the cost reduction by reducing the amount of use of noble metal catalysts.

Powder of iridium black or iridium black oxide is used for a conventional PEMEC anode electrode and the powder is made a slurry by a solvent and applied onto a base material and then the solvent is removed by a calcination process or the like to be carried and supported on the base material. This is not sufficient for close contact between a catalyst layer and the base material and particularly in a high-load environment like operating for a long time in a high current density, catalytic activity is degraded with gradual desorption of catalyst particles, posing a grave problem of durability. To ensure sufficient water electrolysis efficiency and durability, a large quantity of catalyst is needed. Further, the particle size is mostly a dozen or so nm or more and sufficient holes are not obtained and thus, the material transport indispensable for an electrode reaction is inhibited, posing a problem that sufficient water electrolysis efficiency is not obtained.

DETAILED DESCRIPTION

An electrode of an embodiment includes a base material, and a catalyst layer provided on the base material and having a porous structure. When a sum of heights of all peaks belonging to Ir oxide is I0, the height of a peak of $IrO_2$ (110) is I1, and the height of a peak of $IrO_2$ (211) is I2, a ratio of (I1+I2)/I0, which is a ratio of spectra obtained by X-ray diffraction measurements using Kα rays of Cu in the catalyst layer, is 50% or more and 100% or less in a range of a diffraction angle of 20 degrees or more and 70 degrees or less.

Hereinafter, an embodiment to carry out a disclosure will be described with reference to the drawings.

Heretofore, an electrode implementing high catalytic activity and high durability of a porous body catalyst layer having a laminated structure has been developed, but we found from recent research results specialized in an iridium (Ir) oxide based catalyst that high catalytic activity and high durability were obtained from $IrO_2$ (110) of iridium oxide ($IrO_2$) or an $IrO_2$ based catalyst electrode in which $IrO_2$ (211) was formed in a high ratio particularly regarding a PEMEC anode electrode so that stable water electrolysis performance was implemented. This mechanism is not yet been fully understood, but it turns out that a crystal structure of $IrO_2$ (110) and $IrO_2$ (211) formed once is extremely stable with regard to disturbances such as thermal variations and, as a result, even in a high-load environment like operating in a high current density, the crystal structure is stable and high durability can be obtained.

Figure 1:
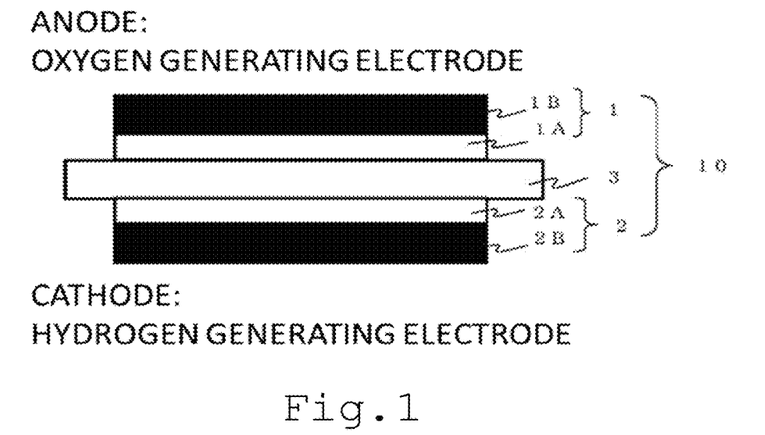
FIG. 1 is a sectional view of a membrane electrode assembly (MEA) according to an embodiment.

FIG. 1 shows a sectional view of a membrane electrode assembly (MEA) according to an embodiment.

An MEA 10 includes a first electrode 1, a second electrode 2, and an electrolytic membrane 3 arranged therebetween.

The first electrode 1 adjacent to the electrolytic membrane 3 has a first gas diffusion layer (base material) 1B and a catalyst layer 1A stacked in this order from above in the drawing. The second electrode 2 has a second gas diffusion layer (base material) 2B and a catalyst layer 2A stacked in this order from below in the drawing. Here, the MEA 10 has a multilayer structure in which multiple catalyst layers are stacked on the base material 1B and each catalyst layer has a porous structure containing multiple holes in respective layers. The shape of a hole is not specifically limited.

Hereinafter, the catalyst layer in the present embodiment will be described in detail.

Figure 2:
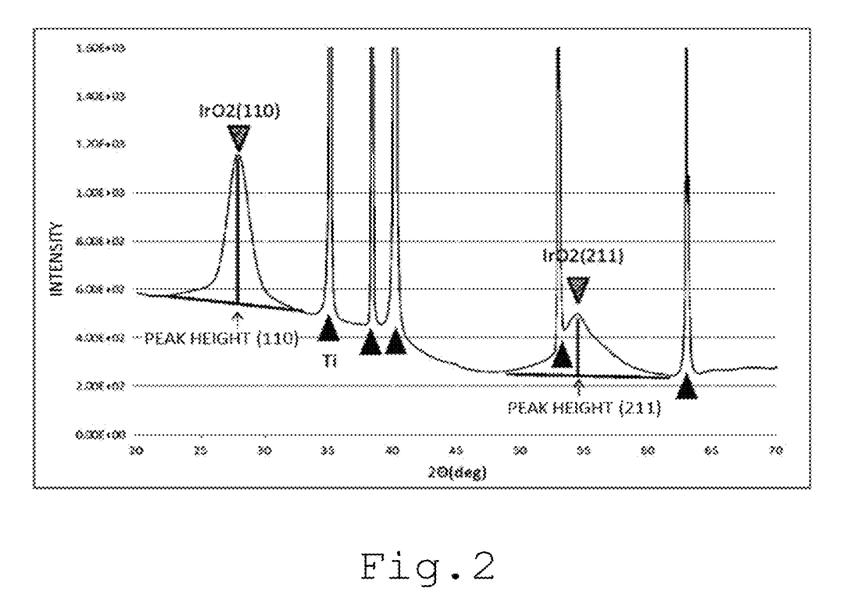
FIG. 2 is a spectrum obtained by X-ray diffraction measurements of an electrode according to an embodiment.

FIG. 2 shows a spectrum obtained by X-ray diffraction (XRD) measurements of an electrode according to an embodiment. As a result of XRD measurements, only two characteristic peaks appeared in $IrO_2$ (110) near 28 degrees and $IrO_2$ (211) near 54 degrees in the range between 20 degrees and 70 degrees of the diffraction angle and no other characteristic peak belonging to $IrO_2$ appeared. The diffraction angle of XRD measurement was set to a value of 2θ when the Bragg angle is θ.

Here, if the sum of the peak height (hereinafter, called I1) of the $IrO_2$ (110) peak and the peak height (hereinafter, called I2) of the $IrO_2$ (211) peak is (I1+I2) with respect to the sum I0 of peak heights of all peaks belonging to Ir oxide, a relative peak height ratio Ia=(I1+I2)/I0 was in the range of 50% or more and 100% or less. Also, a relative peak height ratio Ib=I3/I0 of the sum (hereinafter, called I3) of peak heights belonging the Ir metal to I0 was 5% or less.

The crystallite (diameter of the circumscribed circle of the crystallite) is similarly determined by integrated powder X-ray analysis software PDXL provided with an XRD measuring apparatus (Smart Lab manufactured by Rigaku Corporation) and the crystallite size of an electrode in the present embodiment was about 5 nm (3 nm or more and 6 nm or less). The porosity of the catalyst layer is 70 vol % or more and 30 catalyst layers or less, 25 catalyst layers or less, 20 catalyst layers or less, each of which has the thickness of about 25 nm (20 nm or more and 30 nm or less), are stacked with an average air gap of about 40 nm (35 nm or more and 45 nm or less) in the structure. Preferably, the catalyst layer has a laminated structure of one layer or more or 10 layers or more. The porosity of the catalyst layer is evaluated as follows. First, sample is cut out from the catalyst layer and a sectional SEM (Scanning Electron Microscope sample is obtained. 300,000 times magnified SEM photographs on three regions of the sectional SEM sample are obtained and catalyst and pore are distinguished from contrast. Thickness of the catalyst layer is measured from 50,000 times magnified SEM photographs on the plurality of region of the sectional SEM sample and average thickness of catalyst layer is calculated from measured values. Using the calculated thickness of the catalyst layer, a thickness of noble catalyst is calculated from amount of the noble metal (g) and density of the noble metal catalyst, and the porosity of the catalyst layer (1−(thickness of the noble metal catalyst)/(thickness of catalyst layer)) is calculated. If a literature density data of the catalyst or the noble catalyst is not known, density of the catalyst can be determined theoretically or experimentally A literature density, 11.66 g/cm$^3$ is adopted for a density of iridium oxide catalyst which is main component in the embodiments and examples. The above explained thickness of the catalyst layer is actual thickness of the catalyst layer determined from SEM photographs. For example, When iridium oxide as a main component of the noble metal catalyst is used and nickel oxide as a pore-forming agent material is used, thickness of one layer of catalyst is a thickness which includes volume of iridium oxide, pore volume formed by removing the pore-forming agent material in a treatment for porosity formation, and residue volume of the pore-forming agent material if the pore-forming agent material remains. The thickness of noble metal catalyst is thickness of layer is constituted by only noble metal catalyst which does not includes volume of the pore-forming agent material.

The crystallite (diameter of the circumscribed circle of the crystallite) of the catalyst layer is small (a few nm) and the porosity thereof is high and thus, the material transport indispensable for an electrode reaction becomes smooth, leading to improved catalytic activity.

Figure 3:
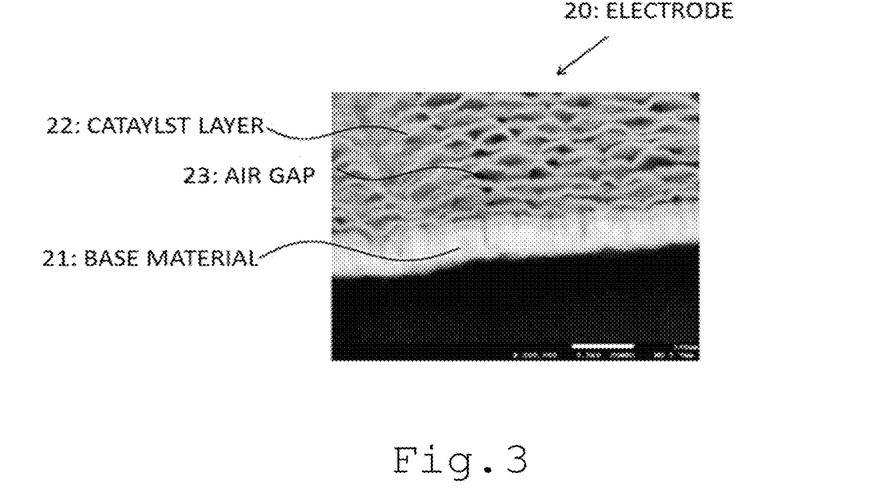
FIG. 3 is an SEM image of the electrode according to an embodiment.

FIG. 3 is an SEM (Scanning Electron Microscope) image of the electrode according to an embodiment. The electrode in the present embodiment has a structure in which at least one layer of a catalyst layer, which is a porous body containing multiple holes, is stacked and thus, a high catalyst specific surface area is obtained. Tiny continua of Ir oxide, which is the main component of the catalyst layer, or other additives are formed between each catalyst layer of the laminated structure. Catalyst layers are partially bonded and substantially all catalyst layers are constrained by the base material, which makes the structure extremely stable. Accordingly, deformation is suppressed with respect to pressure in a lamination direction and also in a long-term operation, detachment of an electrode and peeling between catalyst layers are suppressed so that high durability can be obtained.

As described above, the relative peak height ratio Ia=(I1+I2)/I0 of a spectrum obtained by XRD measurement using Kα rays of Cu of a catalyst layer in an electrode including catalyst layers having a porous structure according to the present embodiment regarding an Ir oxide based PEMEC anode electrode is 50% or more and 100% or less in the range between 20 degrees and 70 degrees of diffraction angle. High catalytic activity and high durability described below (Table 1) are conspicuously obtained from an electrode whose relative peak height ratio Ia is 50% or more and 100% or less. The relative peak height ratio Ia is particularly preferably 70% or more and 100% or less. Also, the relative peak height ratio Ib=I3/I0 is preferably 0% or more and 5% or less.

Excellent characteristics are obtained when the crystallite size (diameter of the circumscribed circle of the crystallite) of an electrode according to the present embodiment is in the range of 2 nm or more and 15 nm or less and particularly preferably, the range is 2 nm or more and 8 nm or less. The catalyst layer of an electrode according to the present embodiment has the porosity of 50 vol % or more and 95 vol % or less. The porosity of the catalyst layer is preferably 70 vol % or more and 95 vol % or less.

Also, the thickness of the catalyst layer of an electrode according to the present embodiment is in the range of 2 nm or more and 500 nm or less. Also, a laminated structure containing at least one catalyst layer of an electrode according to the present embodiment is adopted.

If, as described above, the crystal grain size (diameter of the circumscribed circle of the crystallite) of a catalyst layer is small and the porosity thereof is high, electrode reaction materials are transported smoothly, leading to improved catalytic activity. Also, by setting the thickness of a catalyst layer to 500 nm or less, the catalyst layer can advantageously be created easily by sputtering in terms of manufacture.

For the above calculation of the relative peak height, the peak height from a spectrum of XRD measurement is used, but integrated intensity as the area of peaks may also be used instead.

In the present embodiment, the following definition is provided to quantitatively evaluate the distance between catalyst layers. A sectional SEM photo of an electrode as shown in FIG. 3 is taken, an electrolytic membrane neighborhood and a base material neighborhood on the SEM photo are distinguished and then, the thickness of a catalyst layer and an interlayer air gap are measured to define the catalyst layer thickness and the number of layers.

For an Ir oxide based catalytic material adopted for a catalyst layer in the present environment, other additives may appropriately be selected in accordance with an electrode reaction. From the viewpoint of catalytic activity and durability, a noble metal or noble metal oxide catalyst is preferable and includes at least one noble metal element selected from the group consisting of; Pt, Ru, Rh, Os, Pd, Au and the like. Also, from the viewpoint of forming a stable and rigid laminated structure, a non-noble metal or an oxide thereof including at least one element selected from the group consisting of; Ni, Fe, Mn, Al, Zn, Ta, W, Hf, Si, Mo, Ti, Zr, Nb, V, Cr, and Sn is preferable.

The configuration, elements, and oxide distribution of a catalyst layer can be checked by, in addition to the EDX (Energy Dispersive X-ray Spectroscopy) analysis using the SEM and the XRF (X-ray Fluorescence) analysis, element mapping by a transmission electron microscope (TEM).

The porosity and conductivity are required of the base material of an electrode. When used as an anode of water electrolysis cells, a titanium material is generally adopted to ensure durability. The form of a base material is not specifically limited and a titanium mesh, cloth made of titanium fiber, and a titanium sintered body can be cited. Water electrolysis performance may be improved by adjusting the aperture ratio, particularly the hole structure of a portion in contact with the catalyst layer of a porous base material or surface treatment of the base material such as blasting. This can be considered because the water supply to the catalyst layer and the discharge of electrode reaction products become smooth making an electrode reaction in the catalyst layer promoted. Another coating layer may also be provided on the base material. Durability of an electrode may significantly be improved by a conductive closely-packed coating layer. The coating layer is not particularly limited and metallic materials, oxide, ceramic materials such as nitride, carbon and the like can be used.

When a metallic material such as titanium is used as a base material, durability of the base material can be improved by introducing the coating on the surface of the base material as a base material protective layer. Durability can further be improved by forming a multilayer structure constructed of different materials for the base material protective layer or an inclined structure. When titanium is used for the base material, an oxide layer having the thickness of 10 nm as a base material protective layer and containing iridium is particularly effective. This can be considered because a composite oxide layer in which iridium and titanium are closely packed is formed in the base material protective layer.

Ionic conductivity is frequently required of an electrolytic membrane. As an electrolytic membrane having proton conductivity, for example, a fluororesin having a sulfonic group (for example, Nafion (manufactured by Du Pont K.K.), Flemion (manufactured by Asahi Kasei Corporation), and Asibulec (manufactured by Asahi Glass Co., Ltd.) or an inorganic substance such as tungstic acid and phosphotungstic acid can be used.

The thickness of the electrolytic membrane can appropriately be determined in consideration of characteristics of MEA. From the viewpoint of strength, solubility resistance, and output characteristics of MEA, the thickness of the electrolytic membrane is preferably 10 μm or more and 200 μm or less.

Figure 4:
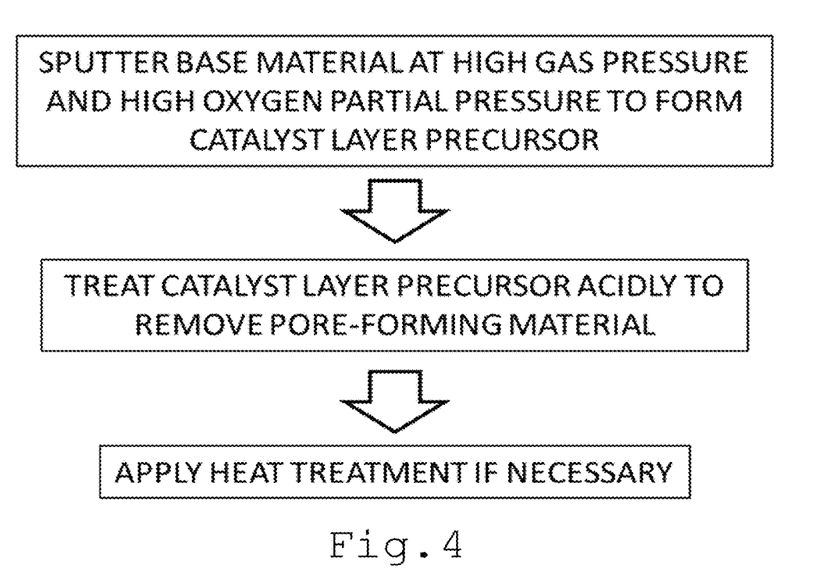
FIG. 4 is an explanatory view showing a manufacturing method of an Ir oxide based catalyst layer according to an embodiment and the electrode.

Hereinafter, the manufacturing method of an electrode having an Ir oxide based catalyst layer according to the present embodiment and the configuration and the manufacturing method of MEA will be described using FIG. 4.

As for an anode electrode, a material containing a catalytic material and a pore-forming agent material are formed on a Ti base material 1B using a vacuum device to produce a catalyst layer precursor. For the production of an iridium oxide based catalyst, particularly a reactive sputtering method that adds an oxygen gas to a chamber using a sputtering device is appropriate. In this case, durability of an electrode and characteristics of an electrochemical cell can significantly be improved by optimizing parameters such as the partial pressure of an oxygen gas, power supply power during sputtering or vapor deposition, and the temperature of the base material. For example, it is preferable to sputter at high gas pressure and high oxygen partial pressure.

Next, the pore-forming agent is removed from the catalyst layer precursor by selective etching using an a such as acid or alkali to obtain an electrode 1.

For a laminated structure precursor containing an air-gap layer, basically, a material containing a catalytic material and a pore-forming agent material are successively formed on a substrate by sputtering or vapor deposition. For a porous body structure precursor, a catalytic material and a pore-forming agent material can simultaneously be formed on a substrate by sputtering or vapor deposition. The thickness and the porosity of a catalyst layer, the number of catalyst layers, and the air gap between catalyst layers can be produced by adjusting power supply power and gas pressure when a membrane is formed, the membrane forming ratio of the catalytic material and the pore-forming material, a removal process of the pore-forming material and the like. Catalyst activity and durability can be improved and the structure of the catalyst layer can be refined by post-treatment such as heat treatment after the pore-forming material is removed. This is because the crystal structure of the catalyst layer after sputtering may be amorphous and so it is preferable to orientate the crystal structure by heat treatment. Heat treatment conditions includes, for example, the temperature of 300 to 500° C. and the duration of 30 min to 4 hours.

When a catalyst layer according to the present disclosure is formed directly on a base material such as titanium, a closely-packed interface layer can be formed between the catalyst layer and the base material and, as a base material protective layer, can significantly suppress degradation of the base material. Accordingly, an electrode according to the present disclosure has excellent durability.

FIG. 3 is an SEM image of Example 1. An electrode 20 has a laminated structure of multiple catalyst layers 22 formed on a base material 21 and an air gap 23 is formed between catalyst layers.

The MEA 10 according to an embodiment is produced by using the above catalyst layer as at least one of first and second catalyst layers 1A, 2A in FIG. 1 and combining with an electrolytic membrane. A junction process of the catalyst layer and the electrolytic membrane is important for the formation of an irregular interface between the catalyst layer and the electrolytic membrane of the MEA 10 according to the present embodiment. The amount of penetration of the catalyst layer into the electrolytic membrane and the penetration distribution and the degree of uniformity of each catalyst layer of the entire catalyst layers can be controlled by the junction process.

In general, a membrane electrode assembly is produced by joining the catalyst layer and the electrolytic membrane through heating/pressurization. When the forming base material of a catalyst layer is a gas diffusion layer, both ends of the membrane electrode assembly are stacked as shown in FIG. 1 by sandwiching the electrolytic membrane 3 between electrodes containing the catalyst layer 1A and the catalyst layer 2A and joined to obtain the MEA 10. When the forming base material of a catalyst layer is a transfer base material, the catalyst layer is transferred from the transfer base material to the electrolytic membrane by heating/pressurization and then, a gas diffusion layer is arranged on the catalyst layer and joined with the counter electrode to produce the MEA 10.

Each member as described above is commonly joined by using a hot pressing machine. The pressing temperature is a temperature higher than the glass transition temperature of a polymer electrolyte used as a binder of the electrodes 1, 2 and the electrolytic membrane 3 and generally, 100° C. or higher 300° C. or lower. The pressing pressure and the pressing time depend on the hardness of the electrodes 1, 2 and generally, the pressure is 5 kg/cm$^2$ or more and 200 kg/cm$^2$ or less and the time is between 5 sec and 20 min. To accurately control the amount of penetration of a catalyst unit, parameter adjustments of the hot pressing machine are important. To obtain the optimum amount of penetration, distribution, and degree of uniformity, the local temperature or local pressure of a heating plate of the hot pressing machine is controlled by adjusting to physical properties and flatness of the base material with a catalyst layer.

A process as described below may also be adopted to join the catalyst layer and the electrolytic membrane. An electrolytic membrane is formed on the base material with a catalyst layer and a catalyst layer of the counter electrode is attached thereonto. If the base material is a gas diffusion layer, the membrane electrode assembly can directly be used as the MEA 10. If the base material is a transfer base material, the membrane electrode assembly is used as the MEA 10 after the gas diffusion layer is replaced. In this case, the penetration of the catalyst unit can be controlled by the concentration of solvent for forming an electrolytic membrane, the configuration and forming temperature thereof, the time and the like.

As described above, the MEA 10 according to an embodiment uses the optimum electrode-electrolytic membrane interface and so has a high degree of water electrolysis stability.

Figure 5:
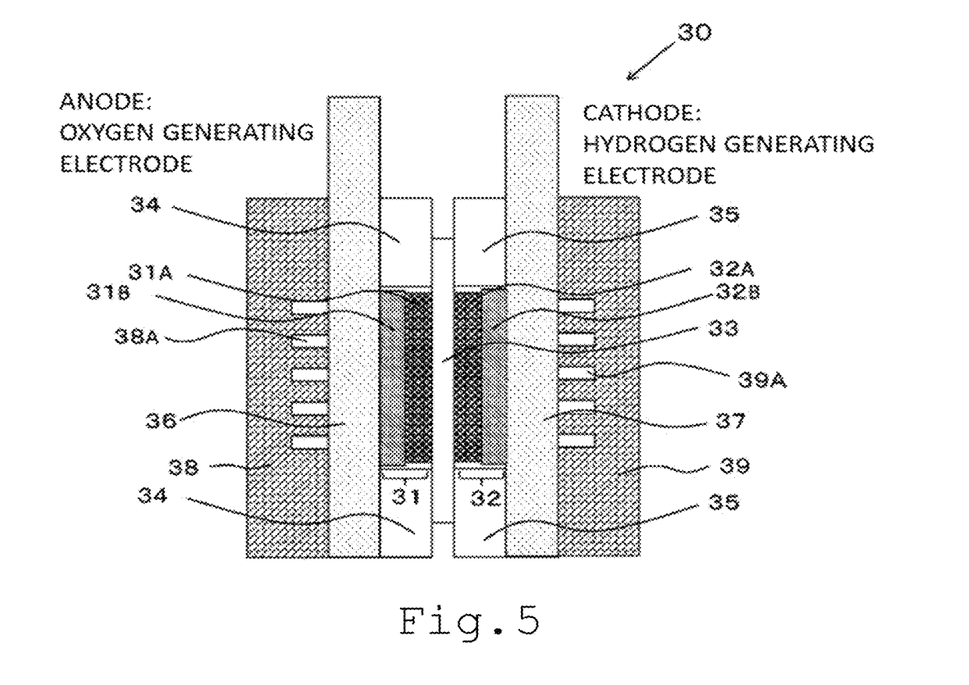
FIG. 5 is a sectional view of an electrochemical cell according to an embodiment.

The configuration and the manufacturing method of an electrochemical cell according to the present embodiment will briefly be described using FIG. 5. MEA has a configuration in which a catalyst layer 31A is formed on a base material 31B as a first electrode 31, a catalyst layer 32A is formed on a base material 32B as a second electrode 32, and an electrolytic membrane 33 is sandwiched between the electrodes. An electrochemical cell 30 is produced on the both sides of MEA by mounting current collector plates 36, 37 and clamping plates 38, 39 via gaskets 34, 35 and clamping the MEA at appropriate pressure.

Figure 6:
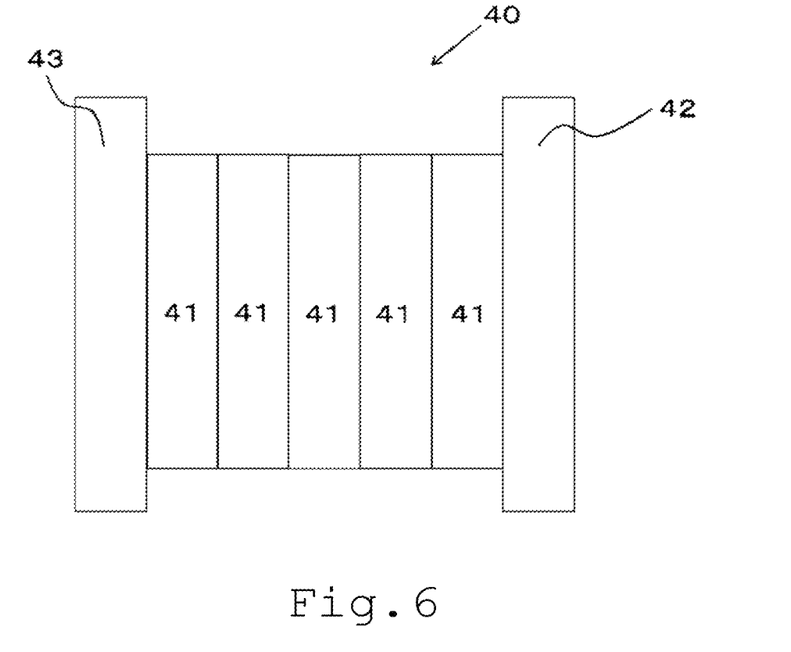
FIG. 6 is a sectional view of a stack according to an embodiment.

The configuration and the manufacturing method of a stack according to the present embodiment will briefly be described using FIG. 6. A stack 40 has a configuration in which a plurality of electrochemical cells 41 is connected in series. A stack is produced by mounting clamping plates 42, 43 on both ends of an electrochemical cell and clamping the electrochemical cell at appropriate pressure.

EXAMPLES

Hereinafter, examples and a comparative example will be described.

In Table 1, the number of catalyst layers of electrodes of Example 1 to 4 and Comparative Example, relative peak height comparison results by XRD, and PEMEC cell evaluation results are summarized.

TABLE 1A

| | Catalyst layer structure | Catalyst layer main component | Loading amount mg/cm$^2$ | Process |
|---|---|---|---|---|
| Example 1 | Lamination Layer | IrO$_2$ | 0.2 | High gas pressure/high oxygen partial pressure sputtering -> Treatment for porosity formation -> Heat treatment |
| Example 2 | Lamination Layer | IrO$_2$ | 0.2 | Low gas pressure/high oxygen partial pressure sputtering -> Treatment for porosity formation -> Heat treatment |
| Example 3 | Lamination Layer | IrO$_2$ | 0.2 | High gas pressure/high oxygen partial pressure sputtering -> Treatment for porosity formation |
| Example 4 | Single layer | IrO$_2$ | 0.2 | Low gas pressure/high oxygen partial pressure sputtering -> Treatment for porosity formation -> Heat treatment |
| Example 5 | Lamination Layer | IrO$_2$ | 0.2 | High gas pressure/high oxygen partial pressure sputtering -> Treatment for porosity formation -> Heat treatment |
| Comparative Example 1 | Lamination Layer | IrO$_2$ | 0.2 | High gas pressure/low oxygen partial pressure sputtering -> Treatment for porosity formation -> Heat treatment |
| Comparative Example 2 | Lamination Layer | IrO$_2$ | 0.2 | High gas pressure/high oxygen partial pressure sputtering -> Treatment for porosity formation -> Heat treatment |

TABLE 1B

| | Relative peak height ratio Ia % | Relative peak height ratio Ib % | Catalytic activity | Durability test results hours |
|---|---|---|---|---|
| Example 1 | 50 | 0 | A | 3000 |
| Example 2 | 80 | 0 | A | 4000 |
| Example 3 | 100 | 0 | B | 2000 |
| Example 4 | 100 | 0 | B | 1000 |
| Example 5 | 50 | 0 | A | 5000 |
| Comparative Example 1 | ND | Ir metal only | B | 10 |
| Comparative Example 2 | Unmeasurable (Catalyst layer Peeled) | Unmeasurable (same as left column) | Unmeasurable (same as left column) | Unmeasurable (same as left column) |

<Electrode Production>
(PEMEC Standard Cathode Electrode)

Carbon paper Toray060 (manufactured by Toray Industries, Inc.) having a carbon layer of the thickness 25 μm was prepared as a base material. A catalyst layer having a laminated structure containing an air-gap layer was formed by the sputtering method such that the loading density of a Pt catalyst became 0.1 mg/cm$^2$ to obtain an electrode having a porous catalyst layer. The electrode was used as the standard cathode electrode in Examples 1 to 4 and Comparative Example. (PEMEC anode electrode production: Examples 1 to 4, Comparative Example)

A titanium mesh base material whose surface was treated was prepared as a base material.

An electrode having a catalyst layer was obtained on the base material by the reactive sputtering method. For the membrane formation, the process, particularly the gas pressure and the oxygen partial pressure was adjusted such that the thickness of the catalyst layer, air gap between catalyst layers, number of layers, and crystal grains $IrO_2$ (110), $IrO_2$ (211) in the catalyst layer were values shown in Table 1. In Examples of this time, the same power supply power conditions were applied for all cases. In some cases, heat treatment at temperature 300 to 500° C. was applied for 30 min to 4 hours.

The crystal peak intensity, crystallite size, porosity, catalyst layer thickness, and number of catalyst layers of various electrode produced were evaluated as described below. First, analysis samples were cut out from electrodes obtained from Examples 1 to 4 and Comparative Example to produce XRD samples and SEM observation samples. XRD data and SEM observation images of each of five samples of each electrode were acquired.

Regarding crystal peaks of catalyst, spectra obtained by XRD measurements using $K\alpha$ rays of Cu were obtained for each sample of Examples 1 to 5 and Comparative Example using the X-ray diffraction apparatus Smart Lab manufactured by Rigaku Corporation as XRD measurements. In the peak analysis of the obtained spectra using the integrated powder X-ray analysis software PDXL, peak heights belonging to $IrO_2$ and Ir were calculated within the range of 20 degrees or more and 70 degrees or less of the diffraction angle to determine the relative intensity ratios Ia, Ib. As a result, Ia=50% to 100% and Ib=0% were obtained in Examples 1 to 5. In Comparative Example 1, all $IrO_2$ peaks were less than limits of detection (ND: 0.01% or less) regarding Ia, and regarding Ib, only the Ir metal was detected.

A method of determining the crystallite size of a catalyst by using the Scherrer method from peak analysis of spectra of XRD is available and as a result of analysis using the integrated powder X-ray analysis software PDXL, the catalyst crystallite size in Examples 1 to 4 was 3 to 6 nm.

The average thickness of catalyst layers of an electrode and the number thereof were measured by making SEM observations and distinguishing holes in the catalyst region and catalyst layers and air gaps between catalyst layers based on the contrast in the range of magnification of 2000 to 300,000. Based on the catalyst layer thickness obtained as described above, the catalyst thickness including metallic oxide was calculated from the catalyst amount (g) including metallic oxide of each electrode and the density thereof and the porosity of the catalyst layer was determined as 1-catalyst thickness including metallic oxide/catalyst layer thickness. When there is no literature value of the relevant catalyst concerning the catalyst density, the catalyst density can be determined theoretically or experimentally. For the density of the $IrO_2$ catalyst used in Examples 1 to 4 and Comparative Example, the literature value 11.66 $g/cm^3$ was adopted.

As a result of the above, it was verified that Examples 1 to 3, 5 and Comparative Example 1 had a lamination layer including a porous body structure or an air gap layer for respective electrodes, Example 4 had a single layer, and Examples 1 to 4 and Comparative Example 1 had the porosity of catalyst layer of 70 vol % or more and 95 vol % or less.

In example 5, catalyst is produced under following conditions: high gas pressure same as example 1, high oxygen partial pressure same as example 1, sputtering time per one catalyst layer being 4/5 of example 1, and number of layers being 5/4 of example 1, and treatment for porosity formation and heat treatment is processed under the same conditions of example 1. From analysis of x-ray fluorescence, loading amount of catalyst of the obtained catalyst being 0.2 $mg/cm^2$ was obtained. From analysis of x-ray diffraction, Ia=50%, Ib=0%, and an average size of crystallite of catalyst being 5 nm were obtained. From analysis of SEM observations, porosity of the catalyst layer being 80%, thickness of one layer of the catalyst layer being about 20 nm, 25 laminated layers each having air gap layer having thickness of about 40 nm were obtained. For reference, the catalyst layer of example 1 has porosity of the catalyst layer being 80%, thickness of one layer of the catalyst layer being about 20 nm, 20 laminated layers each having air gap layer having thickness of about 40 nm. In example 5, thickness of each layers is reduced and number of layers are increased for having same loading amount of catalyst. As a result, number of air gap is increased from 19 of example 1 to 24, catalyst area contributing for reaction is increased more high performance of water electrolysis is enabled and durability is more improved.

In comparative example 2, catalyst is produced under following conditions: high gas pressure same as example 1, high oxygen partial pressure same as example 1, sputtering time per one catalyst layer being 3/5 of example 1, and number of layers being 5/3 of example 1. In comparative example a catalyst structure was planned having porosity of the catalyst layer being 80%, thickness of one layer of the catalyst layer being about 15 nm, and 33 laminated layers each having air gap layer having thickness of about 40 nm. Actually, in the process of treatment for porosity formation same as example 1, catalyst layer were peeled from Ti substrate and the catalyst layer were hardly left on the Ti substrate. When a time period of treatment for porosity formation was reduced to ½, the catalyst layer was peeled from Ti substrate and preferred catalyst was not obtained. A reason of peeling is supposed to be thickness of one catalyst layer is thin, cohesive power of the catalyst layer is decreased when pores were formed in the catalyst layer, the catalyst layer was dispersed in process liquid, and the catalyst layer was peeled from Ti substrate.

When number of layers of the catalyst layer is increased without reducing thickness of each layers of the catalyst layer, loading amount of noble metal is increased and amount of noble metal is not saved. Therefore, preferably, the catalyst layer has a laminated structure of 30 layers or less. More preferably, the catalyst layer has a laminated structure of 25 or less.

<Production of PEMEC MEA>

Square slices of 2 cm×2 cm were cut out from the PEMEC standard cathode electrode and various PEMEC anode electrodes. Various PEMEC MEAs were obtained by combining and joining by thermocompression bonding the standard cathode electrode, an electrolytic membrane (Nafion 117 (manufactured by Du Pont K.K.)), and various anode electrodes (the electrode area is about 4 $cm^2$ and thermocompression bonding conditions: 140° C. to 300° C., 10 to 200 $kg/cm^2$ (pressure), and 10 sec to 5 min).

<Production of PEMEC Single Cells>

The obtained MEA was set to between two separators provided with a channel to produce PEMEC single cells (electrochemical cells).

The produced single cell was used to evaluate water electrolysis performance of the PEMEC cell and stability thereof.

For the water electrolysis performance, the voltage (V) when water electrolysis was performed continuously for one hour by maintaining the temperature of the single cell at 80° C., supplying water to the anode electrode, and passing a current of the current density of 2 $A/cm^2$ was used as a voltage characteristic index. Evaluation criteria in this case are A for 1.9 V or less, B for 1.9 to 2.0 V, and C for 2.0 V or more.

For the stability, a durability test of performing a continuous operation of cell by supplying water to the anode electrode at single cell temperature 80° C. and passing a current of the current density 2 A/cm² was conducted and the operation time in which 110% of the initial voltage was exceeded was used as an index. Table 1 shows the voltage of each electrode and durability test results.

As shown in Table 1, when compared with a single cell into which MEA in Comparative Example is incorporated, single cells into which MEAs in Examples 1 to 4 are incorporated are equivalent in the needed electrolytic voltage (V) and the efficiency of water electrolysis was good. While Comparative Example showed the operation time of 10 hours concerning stability, Examples 1 to 4 were stable for 1000 hours or more, exhibiting high durability.

According to at least one embodiment described above, an electrode structurally stable and having high durability even in a long-term operation with a small amount of noble metal and a membrane electrode assembly can be provided. At the same time, an electrochemical cell and a stack adopting the electrode and the membrane electrode assembly can exhibit high stability and high durability.

In this specification, a portion of elements is represented only by the symbol of element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electrode comprising:
   a base material; and
   a catalyst layer provided on the base material and having a porous structure,
   wherein the catalyst layer comprises $IrO_2$,
   wherein, when a sum of heights of all peaks belonging to Ir oxide is I0, a height of a peak of $IrO_2$ (110) is I1, and a height of a peak of $IrO_2$ (211) is I2, a ratio of (I1+I2)/I0, which is a ratio of spectra obtained by X-ray diffraction measurements using Kα rays of Cu in the catalyst layer, is 100% in a range of a diffraction angle of from 20 degrees to 70 degrees, and
   wherein no other peak belonging to $IrO_2$, excluding the peak of $IrO_2$ (110) and the peak of $IrO_2$ (211), is included in the spectra obtained by X-ray diffraction measurements using Kα rays of Cu in the catalyst layer.

2. The electrode according to claim 1, wherein when a sum of heights of all peaks belonging to Ir metal is I3, a ratio of I3/I0, which is a ratio of spectra, is from 0% to 5%.

3. The electrode according to claim 1, wherein a crystallite size of the catalyst layer is from 2 nm to 15 nm.

4. The electrode according to claim 1, wherein a porosity of the catalyst layer is from 50 vol % to 95 vol %.

5. The electrode according to claim 1, wherein a thickness of the catalyst layer is from 2 nm to 500 nm.

6. The electrode according to claim 1, wherein the catalyst layer comprises from one layer to 30 layers.

7. The electrode according to claim 1, wherein the catalyst layer further comprises a noble metal or a noble metal oxide comprising at least one noble metal element selected from the group consisting of Pt, Ru, Rh, Os, Pd, and Au.

8. The electrode according to claim 1, wherein the catalyst layer further comprises a non-noble metal or an oxide comprising at least one element selected from the group consisting of Ni, Fe, Mn, Al, Zn, Ta, W, Hf, Si, Mo, Ti, Zr, Nb, V, Cr, and Sn.

9. A membrane electrode assembly comprising the electrode according to claim 1.

10. An electrochemical cell comprising the membrane electrode assembly according to claim 9.

11. A stack comprising the electrochemical cell according to claim 10.

12. The electrode according to claim 1, wherein, when a sum of heights of all peaks belonging to Ir metal is I3, a ratio of I3/I0, which is a ratio of spectra, is 0%.

13. The electrode according to claim 1, wherein the catalyst layer consists of iridium oxide.

* * * * *